US008540852B2

(12) United States Patent
Watanabe et al.

(10) Patent No.: US 8,540,852 B2
(45) Date of Patent: Sep. 24, 2013

(54) METHOD AND APPARATUS FOR MANUFACTURING MAGNETORESISTIVE DEVICES (75) Inventors: Naoki Watanabe, Kawasaki (JP); Yoshimitsu Kodaira, Kawasaki (JP); David D. Djayaprawira, Kawasaki (JP); Hiroki Maehara, Kawasaki (JP)

(73) Assignee: Canon Anelva Corporation, Kawasaki-Shi, Kanagawa (JP)

( * ) Notice: Subject to any disclaimer, the term of this patent is extended or adjusted under 35 U.S.C. 154(b) by 1072 days.

(21) Appl. No.: 11/991,967

(22) PCT Filed: Sep. 13, 2006

(86) PCT No.: PCT/JP2006/318141
§ 371 (c)(1),
(2), (4) Date: Aug. 18, 2009

(87) PCT Pub. No.: WO2007/032379
PCT Pub. Date: Mar. 22, 2007

(65) Prior Publication Data
US 2010/0155231 A1  Jun. 24, 2010

(30) Foreign Application Priority Data
Sep. 13, 2005  (JP) .................................. 2005-265257

(51) Int. Cl.
*C23F 1/10*  (2006.01)
(52) U.S. Cl.
USPC ............ 204/192.34; 204/298.25; 204/192.35; 216/67; 216/66; 216/62
(58) Field of Classification Search
USPC ............. 204/192.32, 192.34, 192.35, 298.25; 216/66, 67, 62
See application file for complete search history.

(56) References Cited

U.S. PATENT DOCUMENTS 6,238,582 B1 * 5/2001 Williams et al. ................ 216/22
6,533,906 B2 * 3/2003 Kawakubo et al. ...... 204/192.22
(Continued)

FOREIGN PATENT DOCUMENTS
EP  1 688 924  8/2006
JP  2001-266566 A  9/2001
(Continued)

OTHER PUBLICATIONS

Office Action (Notification of Refusal Reason) dated Apr. 25, 2012, issued in corresponding Japanese Patent Application No. 2010-236446, and an English Translation thereof. (6 pages).

(Continued)

*Primary Examiner* — Keith Hendricks
*Assistant Examiner* — Jason M Berman
(74) *Attorney, Agent, or Firm* — Buchanan Ingersoll & Rooney PC (57) ABSTRACT Disclosed are method and apparatus for manufacturing a magnetoresistive device which are suitable for manufacturing a high-quality magnetoresistive device by reducing damages caused during the processing of a multilayer magnetic film as a component of the magnetoresistive device, thereby preventing deterioration of magnetic characteristics due to such damages. Specifically disclosed is a method for manufacturing a magnetoresistive device, which includes processing a multilayer magnetic film by performing a reactive ion etching on a substrate which is provided with the multilayer magnetic film as a component of the magnetoresistive device. This method for manufacturing a magnetoresistive device includes irradiating the multilayer magnetic film with an ion beam after the reactive ion etching.

6 Claims, 4 Drawing Sheets

(56) References Cited

U.S. PATENT DOCUMENTS

| | | | |
|---|---|---|---|
| 6,538,858 B1* | 3/2003 | Hasegawa et al. | 360/324.12 |
| 6,754,053 B2 | 6/2004 | Yoshikawa et al. | |
| 7,470,374 B2 | 12/2008 | Hattori et al. | |
| 2001/0022373 A1 | 9/2001 | Minakata et al. | |
| 2003/0179071 A1 | 9/2003 | Hiramoto et al. | |
| 2003/0224620 A1 | 12/2003 | Kools et al. | |
| 2004/0086752 A1 | 5/2004 | Hiramoto et al. | |
| 2005/0016957 A1* | 1/2005 | Kodaira et al. | 216/67 |
| 2005/0105325 A1 | 5/2005 | Haneda et al. | |
| 2006/0034022 A1* | 2/2006 | Fukuzawa et al. | 360/324.1 |
| 2006/0158790 A1 | 7/2006 | Freitag et al. | |
| 2006/0168794 A1 | 8/2006 | Contreras et al. | |
| 2008/0062584 A1 | 3/2008 | Freitag et al. | |
| 2009/0007416 A1 | 1/2009 | Contreras et al. | |

FOREIGN PATENT DOCUMENTS

| | | |
|---|---|---|
| JP | 2002-214092 | 7/2002 |
| JP | 2002-299726 A | 10/2002 |
| JP | 2003-078185 A | 3/2003 |
| JP | 2003-86861 A | 3/2003 |
| JP | 2003-203313 A | 7/2003 |
| JP | 2004-118954 | 4/2004 |
| JP | 2004-250778 A | 9/2004 |
| JP | 2004-326831 A | 11/2004 |
| JP | 2005-42143 A | 2/2005 |
| JP | 2005-050468 A | 2/2005 |
| JP | 2005-109013 | 4/2005 |
| JP | 2005-236144 | 9/2005 |
| TW | 550842 | 9/2003 |
| TW | 556233 | 10/2003 |
| TW | 200509367 | 3/2005 |

OTHER PUBLICATIONS

International Search Report (PCT/ISA/210), Dec. 5, 2006.

An English Translation of the Examiner Office Letter issued in the corresponding Japanese Patent Application No. 2007-535502 dated Mar. 1, 2010.

Office Action issued in the corresponding Japanese Patent Application No. 2007-535502 dated Mar. 1, 2010. (English Translation submitted with the Second Information Disclosure Statement).

Extended European Search Report issued in corresponding European Patent Application No. 06810098.1, dated Jun. 22, 2012.

Office Action issued on Feb. 4, 2013 by the Taiwanese Patent Office in corresponding Taiwanese Patent Application No. 095133876, and English language translation thereof.

* cited by examiner

METHOD AND APPARATUS FOR MANUFACTURING MAGNETORESISTIVE DEVICES

TECHNICAL FIELD

The present invention relates to a method and apparatus for manufacturing magnetoresistive devices that may be utilized in the integrated magnetic memories such as MRAM (magnetic random access memory), thin-film magnetic heads and the like.

BACKGROUND

Attention has been focused upon MRAM that is known as the integrated magnetic memory having the packaging density equivalent to that of DRAM, the high speed equivalent to that of SRAM and the unlimited rewritable capability. In addition, the thin-film magnetic heads, magnetic sensors and the like utilizing the magnetoresistive devices such as GMR (giant magnetoresistive) device or TMR (tunneling magnetoresistive) device have been developed rapidly.

For example, there is a magnetoresistive device that has a bottom electrode formed on a silicon, glass or like substrate and an eight-layer film formed as the multilayer film on the bottom electrode for providing the magnetoresistive device, wherein the eight layers include the Ta layer as the lowest layer, the PtMn layer on the Ta layer and acting as the anti-ferromagnetic layer, the pinned layer, the barrier layer, free layer and the protective layer (hard mask), all of which are formed one on another in the order in which they are listed above.

As proposed and disclosed in Japanese patent application No. 2003-203313, Japanese patent application No. 2004-326831 and Japanese patent application 2005-42143, all of which are now opened for the public examination, the magnetoresistive device includes a substrate on which the multilayer magnetic film is formed, in which the substrate is processed by using the thin film processing techniques such as the reactive ion etching (RIE) process, the ion beam etching (IBE) process and the like so that the required performance can be provided.

The inventors of the current patent application have proposed the reactive ion etching process using alcohol (e.g. methanol) as the etching gas that contains at least one or more hydroxyl group. This can increase the etching speed, as compared with the conventional process using the carbon monoxide gas containing ammonia gas as an additive, and can also minimize damages that might be caused mostly by the oxidation that may result from the etching process (as disclosed in Japanese patent application No. 2005-42143).

SUMMARY

When the magnetoresistive devices are manufactured, and are then processed by using the reactive ion etching or similar process such as ion beam etching, it is difficult to obtain a process condition which does not cause any damages to the magnetoresistive devices due to ion bombardment. The RIE process, using alcohol containing at least one or more hydroxyl group as the etching gas as described above is advantageous in that it can minimize these damages (particularly, the deterioration due to the oxidation that might affect the multilayer film). These damages that might still remain on the surface of the multilayer film without being removed after the ion etching process has been completed are becoming more serious problems that need to be solved in connection with the manufacturing of the magnetoresistive devices.

Specifically, it is recognized that, after the surface of the multilayer film has thus been affected by the damages (which will be referred to hereinafter as "the damaged layer or layers"), the deterioration due to the damages will change over the time during the subsequent manufacturing steps during which the devices will be exposed to the atmosphere, washed or cleaned, thermally treated, and so on. It is also recognized that the magnetic properties of the damaged layer will change over the time, which will adversely affect the spin state that produces the magnetoresistive effect in the multilayer magnetic film.

For example, in MRAM, in which data can be read out according to the orientation of the spin of the free layer which is one of the layer in the multilayer magnetic film, the device will operate improperly if there are variations in the magnetic properties that may be caused by the damages during the RIE process. It is said that what makes it difficult to manufacture MRAM having the large density is that the orientation of the spin of the free layer varies largely.

It is therefore an object of the present invention to provide the method and apparatus for manufacturing magnetoresistive devices that are suitable for manufacturing high-quality magnetoresistive devices, wherein the damaged layer that might be produced when the multilayer magnetic film is formed on the magnetoresistive device can be removed during the appropriate process that follows the formation of the multilayer magnetic film, thereby preventing the magnetic properties from being affected by the deterioration due to the damaged layers.

In one aspect, the method for manufacturing magnetoresistive devices, each having a multilayer magnetic film formed on a silicon, glass or like substrate, includes a step of forming a multilayer magnetic layer and then processing the thus formed multilayer magnetic film by using the reactive ion etching process, and wherein the method further includes a step of irradiating the multilayer magnetic film with ion beams following the step of forming and processing the multilayer magnetic film by using the reactive ion etching process. The step of irradiating the multilayer magnetic film with ion beams may be performed by using the ion beam etching process, for example.

Now, consider an example of the magnetoresistive device that may be provided by forming the multilayer magnetic film as described above. In this example, the magnetoresistive device includes the bottom electrode formed on the silicon, glass or like substrate, on which the multilayer magnetic film including the eight layers may be formed for providing the magnetoresistive device. The multilayer magnetic film consists of the lowest layer or Ta layer, the anti-ferromagnetic layer or PtMn layer, the magnetized pinned layer, the barrier layer, the free layer and the protective layer (hard mask), all of which may be formed one on another in the order in which they are listed above.

The step of performing the reactive ion etching process for the formed multilayer magnetic film may be followed by the step of irradiating the multilayer magnetic film with ion beams in which any damaged layers can be removed by irradiating the multilayer magnetic film with ion beams. During this step, the damaged layers on the multilayer magnetic film that may have been affected by the oxidation can be removed, and thus the high-quality multilayer magnetic film can be provided.

In the method for manufacturing magnetoresistive devices as described, the protective film that is formed on the upper surface of the multilayer magnetic film may be used as a mask, for which the reactive ion etching process may then be performed by using alcohol containing at least one or more hydroxyl groups as the etching gas.

When the alcohol containing at least one or more hydroxyl groups is used as the etching gas during the reactive ion etching process, the damages that might be caused on the multilayer magnetic film during the reactive ion etching process can be reduced, and the total time required for the reactive ion etching process and the ion beam etching process that follows the reactive ion etching process can be reduced.

During the ion beam irradiating process, it is preferred that ion beams should be applied at incident angles of between 5 and 80 degrees with regard to the surface of the multilayer magnetic film. This is preferred because atoms or molecules contained in the damaged layer that should have been removed during the ion beam etching process can be prevented from being re-deposited to mostly the lateral walls of the multilayer magnetic film if ion beams are applied beyond the above incident angle range. In this respect, it is more preferred that ion beams should be applied at the incident angles of between 30 and 60 degrees with regard to the surface of the multilayer magnetic film.

Furthermore, it is preferred that the ion beam irradiating process should be performed under the conditions of the accelerating voltages of between 50 and 600 V and the ion electric currents of between 50 and 500 mA. This is preferred because the impact of the ion beams upon the multilayer magnetic film can be reduced. In this respect, it is more preferred that this process should be performed at the accelerating voltage range between 50 and 200 V and ion electric current range between 50 and 200 mA.

Furthermore, it is preferred that the ion beam irradiating process should be performed while the substrate on which the multilayer magnetic film is formed is being rotated. The experiments conducted by the inventors of the present patent application demonstrate that when the substrate is irradiated with ion beams while it is being rotated, atoms or molecules contained in the damage layer that should have been removed during the ion beam etching process can effectively be prevented from being re-deposited mostly to the lateral walls of the multilayer magnetic film.

The following list describes the values of the specific parameters used when the experiments were conducted by the inventors in order to demonstrate that the impact of the ion beams upon the multilayer magnetic film formed on the substrate could be reduced, and that the atoms or molecules contained in the formed multilayer magnetic film that should have been removed during the ion beam etching process could be prevented from being re-deposited to mostly the lateral surfaces of the multilayer magnetic film.

Incident angles (θ) of ion beams with respect to the surface of the multilayer magnetic film: 5 to 80 degrees
Accelerating voltage: 50 to 600 V
Ion current: 50 to 500 mA
Inert gas pressure (for Ar): 6 mPa to 130 mPa
Inert gas pressure (for Kr): 1 mPa to 130 mPa
Inert gas pressure (for Xe): 1 mPa to 130 mPa
Substrate temperature: below 80° C.
Rotating speed of substrate: 30 to 300 rpm
Etching time: 10 sec to 3 min In any of the magnetoresistive device manufacturing methods, the step of irradiating the formed multilayer magnetic film with ion beams may be followed by the step of forming a thin film or protective film, wherein those steps may be performed consistently in the sustained vacuum state.

The protective film may be formed in the clean atmosphere while it is placed in the sustained vacuum state, and the multilayer magnetic film, from which any damaged layers have been removed by the ion beam irradiation, can be protected by the protective film thus formed.

As used here in this specification, the vacuum state means that it is preferred that the vacuum state should equal to the reduced pressure of less than $1.3 \times 10^{-5}$ Pa, but the present invention is not limited to this vacuum state (the degree of vacuum).

The thin film forming step may be performed by using the high frequency and high pressure sputtering technique.

As used here in this specification, the high frequency and high pressure sputtering technique means the sputtering process that may take place in the high frequency range of between 1 KHz and 100 MHz and in the high pressure (vacuum) range of between 1 Pa and 20 Pa. In this case, pulse DC voltage or RF bias voltage may be applied on the substrate.

The high frequency and high pressure sputtering process provides an excellent means to allow the lateral surfaces to be covered over the entire substrate area by varying the conditions of the bias voltage applied to the substrate and pressure during the sputtering process.

Specifically, even when the multilayer magnetic film formed on the substrate contain projections and depressions, the high frequency and high pressure sputtering process can be used to control the thickness of the lateral sides inside the depressions as well as the thickness of both the lateral sides of the projections, and can be used to provide the excellent symmetry on those lateral sides of the projections. For the magnetoresistive device that is used on the magnetic head, the projecting portion that provides the magnetoresistive effect (the part corresponding to the gap length of the head) and the portion that forms the hard bias layer must be covered with an extremely thin insulating layer, such as AlN or $Al_2O_3$ film, for example. When the film is formed by the high frequency and high pressure sputtering process, the extremely thin insulating layer thus formed can provide the excellent symmetry on both the lateral sides of the projections.

An apparatus for manufacturing magnetoresistive devices may be used in conjunction with the method for manufacturing magnetoresistive devices that has been described so far, wherein the apparatus includes a vacuum transfer chamber and a reactive ion etching chamber that is communicatively connected to the vacuum transfer chamber. The substrate having the multilayer magnetic film formed thereon for providing the magnetoresistive device may be transferred from the vacuum transfer chamber into the reactive ion etching chamber where the multilayer magnetic film may be processed by using the reactive ion etching process, and then may be transferred from the reactive ion etching chamber back into the vacuum transfer chamber. The transfer of the substrate including the multilayer magnetic film between the vacuum transfer chamber and reactive ion etching chamber may take place in the sustained vacuum state. The apparatus further includes an ion beam etching chamber that is communicatively connected to the vacuum transfer chamber and in which the ion beam etching process may be performed by irradiating the above substrate with ion beams. The transfer of the substrate from the reactive ion etching chamber into the vacuum transfer chamber, from the vacuum transfer chamber into the ion beam etching chamber and finally from the ion beam etching chamber back into the vacuum transfer chamber may take place in the sustained vacuum state.

In the apparatus for manufacturing magnetoresistive devices, it is also preferred that the reactive ion etching process for processing the multilayer magnetic film thus formed should be performed using the alcohol containing at least one or more hydroxyl groups as the etching gas.

When the reactive ion etching process is performed on the formed multilayer magnetic film using the alcohol containing at least one or more hydroxyl groups as the etching gas, there is the risk that some damaged layers may occur, but they are negligible because they are at most only several tens of angstroms thick. As the reactive ion etching process may be followed by the ion beam irradiating process, the damaged layers can be removed during the ion beam irradiating process with less power and without causing any more damages such as damaged crystals. In this way, the manufacturing efficiency can be increased with the increased throughput per hour.

The ion beam etching chamber contains a substrate supporting holder on which a substrate being irradiated with ion beams may be placed, in which the substrate supporting holder is capable of being rotated while the substrate on its holder is being irradiated with ion beams.

When the substrate having the multilayer magnetic film formed thereon is irradiated with ion beams while it is being rotated, the atoms or molecules contained in the damaged layer that should have been removed during the preceding ion beam etching process can be prevented from being re-deposited to mostly the lateral wall surfaces of the multilayer magnetic film.

In the apparatus for manufacturing magnetoresistive devices, the thin film forming chamber is also provided, which is communicatively connected to the vacuum transfer chamber as described above. Thus, the substrate having the multilayer magnetic film formed thereon may be transferred from the ion beam etching chamber into the vacuum transfer chamber, from which it may be transferred into the thin film forming chamber. The transfer of the substrate from the ion beam etching chamber to the vacuum transfer chamber and from the vacuum transfer chamber into the ion beam etching chamber can take place in the sustained vacuum state.

As the vacuum transfer chamber is communicatively connected to the thin film forming chamber under the sustained vacuum condition where the protective film may be formed, any damaged layers that may have occurred during the reactive ion etching process can be removed by irradiating the damaged layers with ion beams, and then the multilayer magnetic film may be cleaned and covered with the protective film, thereby maintaining the multilayer magnetic film to be clean.

The thin film forming process should preferably be performed by using the sputtering technique under the high frequency and high pressure conditions, specifically, in the high frequency range of between above 1 KHz and below 100 MHz and in the high pressure (vacuum) range of between above 1 Pa and below 20 Pa. That is, the high frequency and high pressure sputtering process may be used under the sustained vacuum condition. When this high frequency and high pressure sputtering process is used, as described earlier, the excellent coverage of the lateral sides of the formed multilayer magnetic film over the entire area thereof can be provided by varying the conditions under which the pressure is to be applied during the sputtering process.

In the apparatus for manufacturing magnetoresistive devices as described above, it is preferred that when the multilayer magnetic film is processed in the ion beam etching chamber, the ion beams should be applied at the incident angles of between 5 and 80 degrees with respect to the surface of the formed multilayer magnetic film, although more preferably the above incident angles may be adjusted to the range of between 30 and 60 degrees.

When the ion beams are applied at any of the above incident angles of between 5 and 80 degrees, preferably between 30 and 60 degrees, the atoms or molecules in the damaged layer that should have been removed during the ion beam etching process can be prevented from being re-deposited to mostly the lateral wall sides of the multilayer magnetic film.

Preferably, the ion beams should be applied adjustably at any of the accelerating voltages of between 50 to 600V (more preferably between 50 and 200V) and at any of the ion currents of between 50 and 500 mA (more preferably between 50 and 200 mA).

The voltage and ion current ranges as specified above are preferred because the impact of the ion beams upon the multilayer magnetic film can be reduced.

In another embodiment of the apparatus for manufacturing magnetoresistive devices, the substrate having a multilayer magnetic film formed thereon for providing the magnetoresistive device may be processed by using the reactive ion etching process. In this embodiment, the apparatus includes a vacuum chamber which is maintained in the sustained vacuum state and in which a means for etching the multilayer magnetic film by using the reactive ion etching process and a means for irradiating the thus reactive ion etched multilayer magnetic film with ion beams.

The apparatus according to the embodiment described above is the inline-type apparatus, in which the means for etching the multilayer magnetic film by using the reactive ion etching process may be implemented by the reactive ion etching technique, for example, and the means for irradiating the multilayer magnetic film with ion beams may be implemented by the ion beam etching technique, for example.

In the vacuum chamber that is maintained in the sustained vacuum state, a means for etching the hard mask layer with the photoresist layer as the PR mask in the multilayer magnetic film is also provided ahead of the reactive ion etching means, wherein this etching may be performed using the reactive ion etching process.

In the vacuum chamber maintained in the sustained vacuum state, a means for forming a thin film is also provided. The thin film may be formed for protecting the multilayer magnetic film that has been irradiated with ion beams by the preceding ion beam irradiating means.

Preferably, the thin film formation by the thin film forming means may be performed using the high frequency and high pressure sputtering method under the sustained vacuum condition, more specifically, under the conditions of the high frequency range of between above 1 KHz and below 100 MHz and of the high pressure (vacuum) range of between above 1 Pa and below 20 Pa.

In the inline-type apparatus as described above, the ion beam etching chamber in which the substrate may be irradiated with ion beams by the ion beam irradiating means such as the ion beam etching device preferably includes a substrate supporting holder that is capable of being rotated, so that the substrate placed on the holder can be irradiated with ion beams while the holder is being rotated.

In the ion beam irradiating means such as the ion beam etching device, the ion beam etching process can be performed against the multilayer magnetic film, by irradiating the multilayer magnetic film with the ion beams preferably at the incident angles of between 5 and 80 degrees, more preferably and adjustably between 30 and 60 degrees with regard to the surface of the multilayer magnetic film, preferably at the accelerating voltages of between 50 and 600 V, more preferably and adjustably between 50 and 200 V, and preferably at the ion currents of between 50 and 500 mA, more preferably and adjustably between 50 and 200 mA.

In accordance with the method and apparatus for manufacturing magnetoresistive devices, any damaged layers that might inevitably occur on the multilayer magnetic film when the multilayer magnetic film is formed on the substrate by using the etching gas during the reactive ion etching process can be removed by irradiating the multilayer magnetic film with the ion beams. Thus, the high quality magnetoresistive devices can be provided. The yield can be improved with the improved magnetic properties, and the manufacturing efficiency can be enhanced accordingly.

As it may be understood from the foregoing description, the ion beam irradiating process during which the damaged layer can be removed may be followed by the thin film forming process in which the protective film can be formed, and these two processes can proceed consistently in the sustained vacuum state. Thus, the protective film can be formed under the clean atmosphere and in the sustained vacuum state, and the resulting multilayer magnetic film from which the damaged layer has been removed by irradiating it with the ion beams can be covered with the protective film. As a result, the multilayer magnetic film can be kept clean.

BRIEF DESCRIPTION OF DRAWINGS

FIG. 1 (a) is a flowchart diagram illustrating the steps in the manufacturing method in accordance with one embodiment of the present invention;

FIG. 1 (b) illustrates the cross section structure of the substrate having the multilayer magnetic film formed thereon for providing the magnetoresistive device, wherein the multilayer magnetic film is to be processed in accordance with the steps described in the flowchart of FIG. 1 (a);

DETAILED DESCRIPTION OF THE PREFERRED EMBODIMENTS

Figure 1:
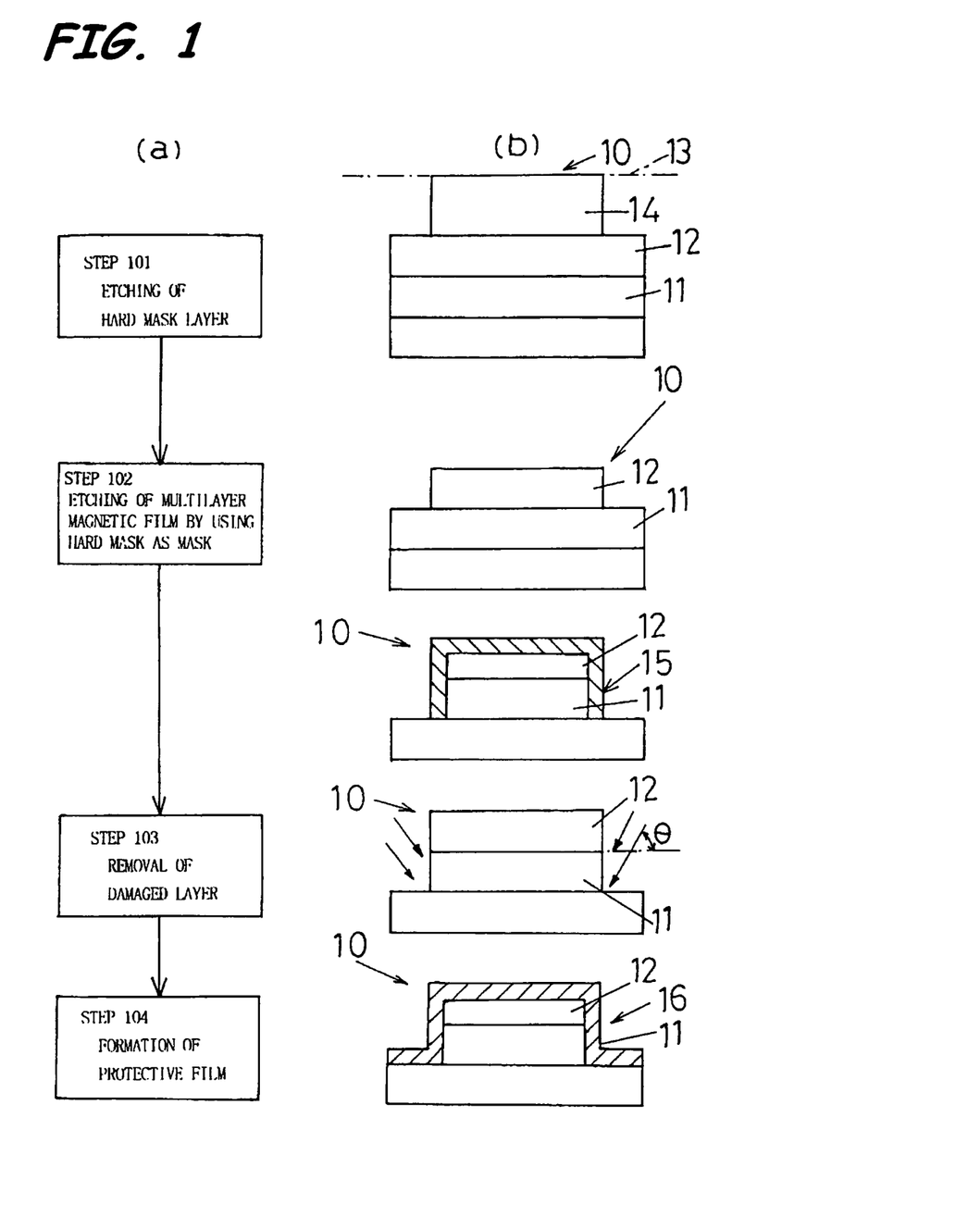

FIG. 1 (a) is a flowchart diagram illustrating the processing steps of the method for the magnetoresistive devices in accordance with one preferred embodiment of the present invention, and FIG. 1 (b) illustrates the structure in cross section of a substrate 10 having the multilayer magnetic film being formed thereon according to each corresponding one of the processing steps in FIG. 1 (a), thereby providing a magnetoresistive device. Hereinafter, "the substrate 10 having the multilayer magnetic film formed thereon" will be referred to simply as "the substrate 10".

In FIG. 1 (b), the portion of the substrate 10 represented by reference numeral 11 corresponds to the multilayer magnetic film. This multilayer magnetic film may consist of multilayers such as TMR (tunnel magnetoresistive) layer, GMR (giant magnetoresistive) layer having the CPP (current perpendicular to plane) structure, TMR layer or GMR layer having the CPP structure including a biasing layer that defines the magnetization orientation of the free layer or, GMR layer having the CCP structure including the anti-ferromagnetically coupled multilayer film, GMR layer having the CCP structure including the specular spin valve-type multilayer magnetic film, and GMR layer having the CCP structure including the dual spin valve-type multilayer magnetic film. Hereinafter, those listed above will be referred to collectively as "the multilayer magnetic film").

Figure 4:
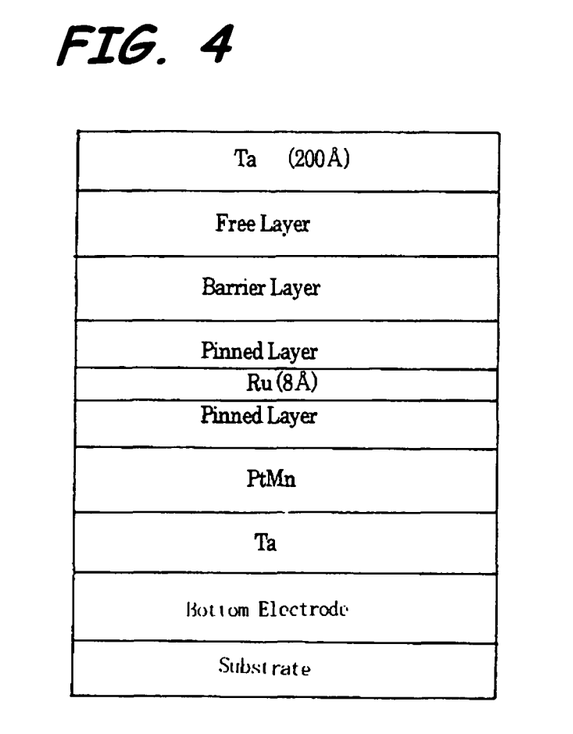
FIG. 4 is a diagram illustrating one example of the cross section structure of the substrate having the multilayer magnetic film formed thereon for providing the magnetoresistive device.

The multilayer magnetic film 11 may be formed as shown in FIG. 4, for example, such that it includes a bottom electrode formed on the substrate and a multilayer magnetic film formed on the bottom electrode, thereby providing the magnetoresistive device. In the example shown in FIG. 4, the multilayer magnetic film 11 consists of eight layers including the Ta layer as the lowest layer, the PtMn layer as the anti-ferromagnetic layer, the magnetized pinned layer, the barrier layer, the free layer, and the protective layer (hard mask), all of which may be formed one on another in the order listed above. In the example shown in FIG. 4, the Ru layer in the magnetic pinned layer is 8□ thick, and the protective layer (hard mask) or Ta layer is 200 Å thick.

In FIG. 1 (b), the portion as indicated by reference numeral 12 represents the protective film which may be a single layer film or multiple layer film composed of any of single chemical elements such as Ta (tantalum), Ti (titanium), Al (aluminum) and Si (silicon), or may be a single layer film or multiple layer film composed of oxide or nitride of any of Ta, Ti, Al and Si.

Figure 2:
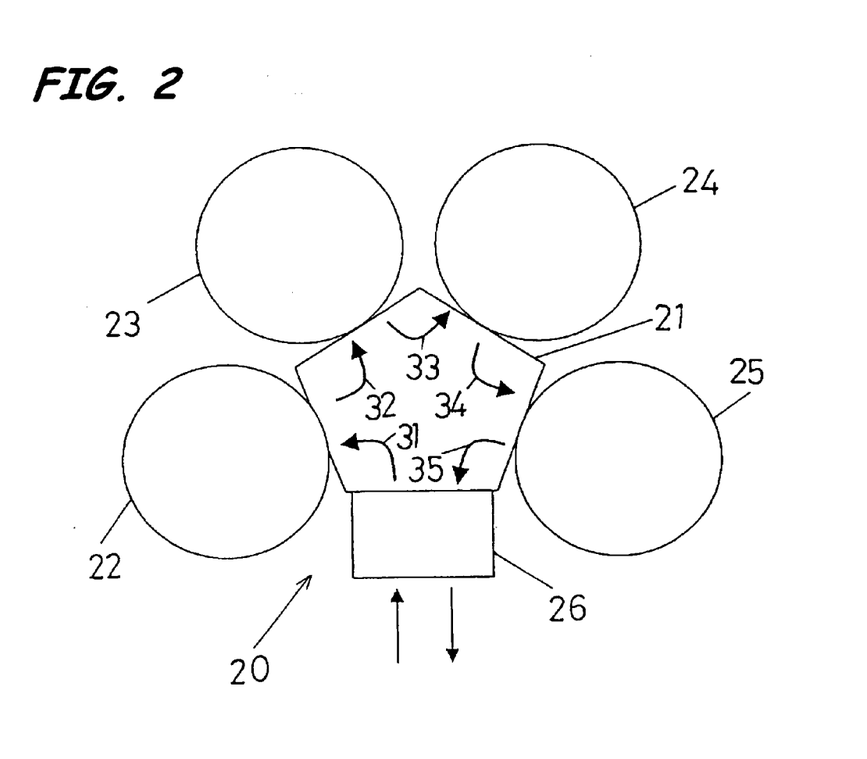
FIG. 2 illustrates the general construction of an example of the apparatus for manufacturing magnetoresistive devices in accordance with one embodiment of the present invention.

FIG. 2 illustrates the structure of the apparatus 20 for manufacturing magnetoresistive devices in accordance with one preferred embodiment of the present invention.

In FIG. 2, the apparatus 20 includes a vacuum transfer chamber 21, a first reactive ion etching chamber 22, a second reactive ion etching chamber 23, an ion beam etching chamber 24 and a thin film forming chamber 25, wherein each of the first reactive ion etching chamber 22, second reactive chamber 23, ion beam etching chamber 24 and thin film forming chamber 25 is provided so that it can communicate with the vacuum transfer chamber 21 through any suitable cutoff means (not shown) such as a gate valve.

In addition, a wafer loader 26 is provided in the vacuum transfer chamber 21. The wafer loader 26 may be operated so that a substrate can be loaded into the vacuum transfer chamber 21, and that the substrate can then be unloaded from the vacuum transfer chamber 21 after it has gone through the processing chambers mentioned above.

A transfer means (not shown) is also provided in the vacuum transfer chamber 21. This transfer means is provided so that the substrate 20 loaded into the vacuum transfer chamber 21 can be transferred as indicated by arrows 31, 32, 33, 34 and 35, that is, can be transferred from the vacuum transfer chamber 21 into the first reactive ion etching chamber 22, from the first reactive ion etching chamber 22 into the second reactive etching chamber 23, from the second reactive etching chamber 23 into the ion beam etching chamber 24, and finally from the ion beam etching chamber 24 into the thin film forming chamber 24.

Those transfers of the substrate 10 as indicated by arrows 31, 32, 33, 34 and 35 can be performed in the sustained vacuum state through the vacuum transfer chamber 21.

In other words and more specifically, the substrate 10 may be transferred from the first reactive ion etching chamber 22 into the second reactive ion etching chamber 23, from the second reactive ion etching chamber 23 into the ion beam etching chamber 24, and finally from the ion beam etching chamber 24 into the thin film forming chamber 25 in such a manner that those transfers can be performed in the sustained vacuum state and under the clean atmosphere. In the ion beam etching chamber 24, any damaged layer that may occur in the preceding chambers can be removed in the sustained vacuum state, and in the thin film forming chamber 25, the protective film can be formed on the surface from which the damage layer has thus been removed.

After the processing is completed in the thin film forming chamber 25, the substrate 10 may then be transferred from the thin film forming chamber 25 back into the vacuum transfer chamber 21 as indicated by arrow 35. Finally, the substrate 10 may be unloaded from the vacuum transfer chamber 21 to the outside by the wafer loader 26.

Now, the processing steps described in the flowchart shown in FIG. 1 (a) will be described below.

As an initial step, the substrate 10 will be loaded into the vacuum transfer chamber 21, from which it will then be transferred into the first reactive ion etching chamber 22 where the reactive ion etching process is performed for the hard mask layer 12 with the photoresist layer 13 formed on the surface of the multilayer magnetic film 11 being used as the PR mask 14 (step 101).

Next, the substrate 10 will be transferred from the first reactive ion etching chamber 22 into the second reactive ion etching chamber 23 while it is placed in the sustained vacuum state. In the second reactive ion etching chamber 23, the reactive ion etching process, or more specifically, the fine etching process, will then be performed for the multilayer magnetic film 11 with the hard mask layer 12 as the mask, by using alcohol containing at least one or more hydroxyl group as the etching gas (step 102).

In the example shown in FIG. 4, this reactive ion etching process may be performed so that the etching can go through the barrier layer in the multilayer magnetic film 11 until it reaches the PtMn layer which is the anti-ferromagnetic layer located on top of the Ta layer. As one step of manufacturing MRAM, the reactive ion etching process may be performed until the etching reaches the free layer, and may be stopped at the barrier layer. The reactive ion etching process (step 102) may be employed in either of those two cases.

Using alcohol containing at least one or more hydroxyl groups as the etching gas can increase the etching speed and reduce the damaged layers (mostly, the layers that may be deteriorated by the oxidation), as compared with using conventional carbon monoxide gas with ammonia gas added thereto. For example, by using alcohol containing at least one or more hydroxyl groups as the etching gas, the thickness of the layer that may be deteriorated by the oxidation can be kept to the order of several tens of angstroms.

As described, when the substrate 10 is processed in the second reactive ion etching chamber 23, there is some risk that a damaged layer 15 may occur, as a result of the deterioration caused mostly by the oxidation, on the lateral wall and upper surface of the multilayer magnetic film 11 or on the lateral wall and upper surface of the hard mask layer 12 partly remaining on the lateral wall and upper surface of the multilayer magnetic film 11, as shown on the third row from the top in FIG. 1 (b).

After the substrate 10 has been processed in the second reactive ion etching chamber 10, it may then be transferred into the ion beam etching chamber 24 in the sustained vacuum state, where the damaged layer 15 will be removed (step 103).

Specifically, in the ion beam etching chamber 24, the damaged layer 15 may be removed by exposing it to the ion beams using any inert gas, such as gas that contains Ar (argon), Kr (krypton), Xe (xenon) or the like.

As described above, even when the substrate 10 is processed by using alcohol containing at least one or more hydroxyl groups as the etching gas in the reactive ion etching chamber 23, it is likely that some damaged layer 15 will occur. Then, such damaged layer 15 may be removed by exposing it to the ion beams. In this way, the substrate 10 on which the high quality multilayer magnetic film has been formed can be obtained.

The ion beam etching process that takes place in the ion beam etching chamber is different from the plasma cleaning process. As described, when the multilayer magnetic film 11 is irradiated with the directional ion beams at the particular incident angles with respect with the surface of the formed multilayer magnetic film, the damaged layer 15 may be removed by causing the ion beams to impact upon it. By using the ion beam etching process, part of the atoms or molecules in the damaged layer 15 can be prevented from being re-deposited on the side of the multilayer magnetic film 11.

Thus, when the multilayer magnetic film 11 is exposed to the ion beams in the ion beam etching chamber 24, it is desirable that the incident angles (θ) of the ion beams with regard to the surface of the formed multilayer magnetic film 11 as shown in FIG. 1 (b) can be varied.

As demonstrated by the experiments conducted by the inventors of the current patent application, some parts of the atoms or molecules in the damaged layer 15 that have been removed by causing the ion beams to impact upon the damaged layer 15 can be prevented from being re-deposited to the side of the multilayer magnetic film 11 when the ion beams are applied at any of the incident angles (θ) of between 5 and 80 degrees, preferably between 30 and 60 degrees.

When the ion beam etching process takes place in the ion beam etching chamber 24, some parts of the atoms or molecules in the damaged layer 15 that have been removed by causing the ion beams to impact on it can also be prevented from being re-deposited to the side of the multilayer magnetic film 11 by exposing the substrate 10 to the ion beams while the substrate 10 is being rotated. For example, it is preferred that the substrate supporting holder (not shown) provided in the ion beam etching chamber 24 is capable of being rotated while the substrate 10 on its holder is being exposed to the ion beams.

As demonstrated by the experiments conducted by the same inventors, some parts of the atoms or molecules in the damaged layer that has been removed by the impact of the ion beams can also be prevented from being re-deposited to the side of the multilayer magnetic film 11 by exposing the substrate 10 to the ion beams while the substrate 10 is being rotated at 30 to 300 rpm.

When the reactive ion etching process takes place in the second reactive ion etching chamber 23 by using alcohol containing at least one or more hydroxyl group as the etching gas, the damaged layer 15 that may be formed during the reactive ion etching process will have the thickness of at most several tens of angstroms. Then, the ion beam etching process in the ion beam etching chamber 24 can be performed at the low power and without producing any further damages such as crystal damages, and this can also be realized without reducing the throughput per hour and therefore without reducing the manufacturing efficiency.

In other words and more specifically, the damaged layer that may occur during the reactive ion etching process within the second reactive ion etching chamber 23 is less thick as compared with the damaged layer that occurs during the conventional reactive ion etching process using the carbon monoxide gas with added ammonia gas, and the removal of the damaged layer during the subsequent ion beam irradiating process can be performed during the reactive ion etching process. Thus, the manufacturing efficiency of the apparatus can be enhanced. According to the method and apparatus 20 for manufacturing magnetoresistive devices, therefore, the manufacturing yield can be increased without reducing the throughput per hour and without reducing the manufacturing efficiency.

After the damaged layer 15 has been removed from the substrate 10 as described above, it may be transferred into the thin film forming chamber 25 while it is placed in the sustained vacuum state where the protective film 16 may be formed (step 104).

The substrate 10 from which the damaged layer 15 has been removed and whose multilayer magnetic film 11 has been cleaned and covered with the protective film 16 can be placed in the clean state.

The thin film forming chamber 25 is the one where the high frequency and high pressure sputtering method is performed. For example, the formation of the protective film 16 in step 104 may be performed under the high frequency and high pressure conditions, more specifically, in the high frequency range of between above 1 KHz and below 100 MHz and in the high pressure (vacuum) range of between above 1 Pa and below 20 Pa.

The protective film 16 may be formed from aluminum nitride, for example.

Now, one example of manufacturing a multilayer magnetic device by following the steps shown in FIG. 1 (a) and FIG. 1 (b), using the apparatus 20 of the present invention that has been described above in connection with FIG. 2.

(1) Step 101: To etch the hard mask layer 12 with the photoresist layer 13 as the PR mask 14:

The reactive ion etching apparatus, such as, for example, the apparatus that includes the ICP (Inductive Coupled Plasma) plasma source supply, may be used, and in the first reactive ion etching chamber 22, the etching process may be performed for the hard mask layer 12 with the photoresist layer 13 as the PR mask 14 under the conditions listed below:
Etching gas: $CF_4$
Flow rate of etching gas: 426 mg/min (50 sccm)
Hard mask layer: Ta layer
Source power: 500 W
Bias power: 70 W
Pressure in the first reactive ion etching chamber 22: 0.8 Pa
Temperature of substrate holder: 80° C.

(2) Step 102: To etch the multilayer magnetic film 11 with the hard mask layer 12 as the mask:

Like the preceding step 101, the reactive ion etching device, such as, for example, the etching apparatus that includes the ICP (Inductive Coupled Plasma) plasma source supply may be used, and in the second reactive ion etching chamber 23, the etching process may be performed for the multilayer magnetic film 11 with the hard mask layer (Ta layer) 12 as the mask under the conditions listed below:
Etching gas: $CH_3OH$ gas
Flow rate of etching gas: 18,756 mg/min (15 sccm)
Hard mask layer: Ta layer
Source power: 1000 W
Bias power: 800 W
Pressure in the second reactive ion etching chamber 23: 0.4 Pa
Temperature of substrate holder: 40° C.
Etching time: 3 min Step 103: To remove the damaged layer 15 by exposing it to the ion beam etching:

The damaged layer 15 may be removed by exposing it to the ion beams within the ion beam etching chamber 24 on the ion beam etching device, under the conditions listed below:
Source power: 100 W
Incident angles of ion beams (θ): 50 to 80 degrees
Accelerating voltage: 250 V
Ion current: 70 mA
Inert gas pressure (for Ar): 6 mPa to 130 mPa
Substrate temperature: 80° C.
Rotation speed of substrate holder: 10 rpm
Etching time: 3 min
(Etching speed: 0.2 Å/sec)

Then, the magnetoresistive device that has been obtained through the steps 101, 102 and 103 described above has been compared with the magnetoresistive device that has been obtained through the steps 101 and 102 but not through step 103 under the same conditions as the magnetoresistive device mentioned above in respect to the respective MR ratios (magnetic resistance ratio=$(R_{max}-R_{min})/R_{min}$).

The results of the above comparison show that the MR ratio of the magnetoresistive device obtained through the steps 101, 102 and 103 has been improved by 20%, as compared with the MR ratio of the magnetoresistive device obtained through the steps 102 and 103 but not through the step 102, that is, not through the ion beam etching process for removing the damaged layer 15.

The number of substrates 10 that can be processed per hour (as expressed in terms of the throughput) may be rate-determined by the processing time of the reactive ion etching process. In other words, even when the ion beam etching process is added, the ion beam etching process can be completed within the processing time of the reactive ion etching process. Thus, the yield can be improved and the magnetic properties (MR ratio) can be improved without affecting the throughput so that the manufacturing efficiency can be increased.

(4) Step 104: To form the protective film 15:

In the thin film forming chamber 25 within the vacuum processing apparatus, the aluminum nitride (AlN) film may be formed as the protective film 16 by using the 13.56 MHz high frequency and high pressure sputtering method (Al target) under the conditions listed below, and the multilayer magnetic film 11 may be covered with the protective film 16 after the damaged layer 15 has been removed from the multilayer magnetic film 11 and cleaned:
Sputtering gas: $Ar+N_2$
Pressure inside the thin film forming chamber 25: 8 Pa
Temperature of the substrate holder: 200° C.

Although the preferred embodiment of the present invention has been described so far by referring to the accompanying drawings, various alterations, modifications, and changes may be made to the embodiment described above without departing from the scope and spirit of the invention as defined in the claims and equivalents thereof.

Figure 3:
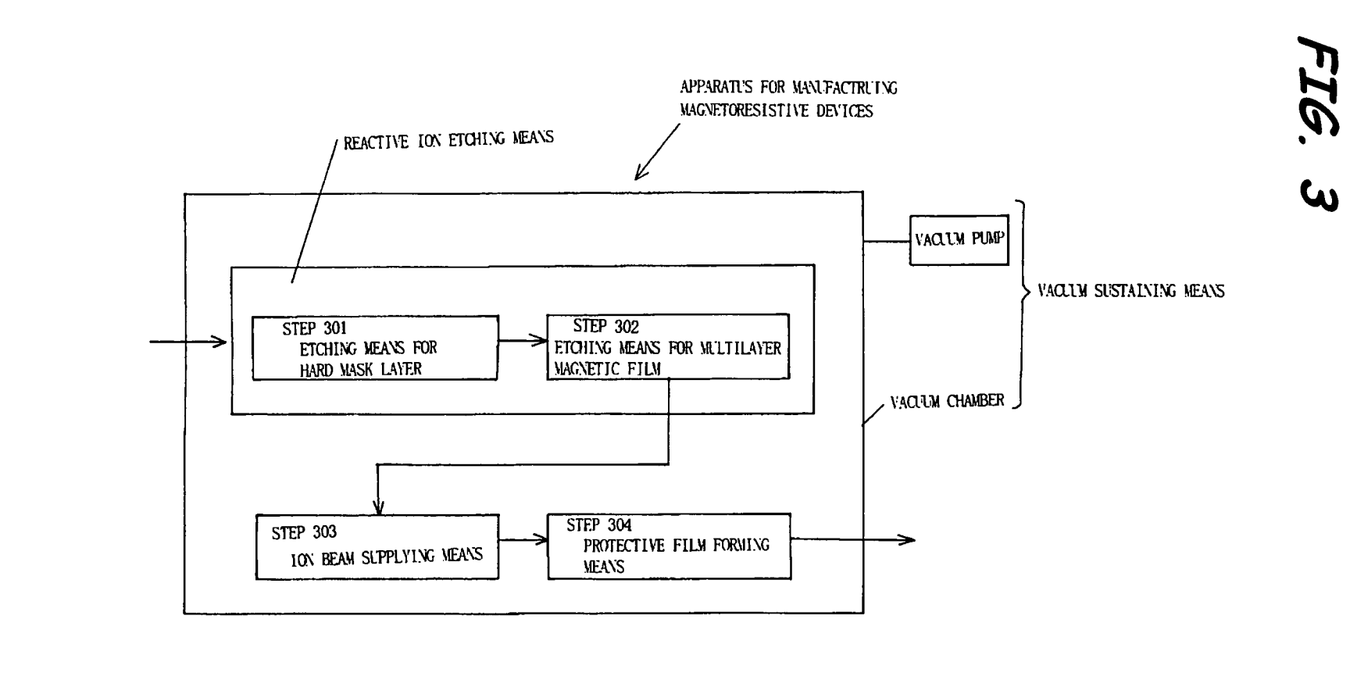
FIG. 3 is a block diagram illustrating the general construction of an example of the apparatus for manufacturing magnetoresistive devices in accordance with another embodiment of the present invention.

For example, the apparatus for manufacturing magnetoresistive devices may be the inline-type apparatus as shown in FIG. 3, in which the method for manufacturing magnetoresistive devices can be implemented.

Specifically, the apparatus for manufacturing magnetoresistive devices that is provided in accordance with the present invention may be configured to include a vacuum chamber that is internally maintained in the sustained vacuum state, a means for permitting the reactive ion etching process to be used for the multilayer magnetic film formed on the substrate, thereby providing a magnetoresistive device, and a means for permitting the ion beams to be applied upon the multilayer magnetic film that has been processed by the reactive ion etching process, wherein the two means mentioned above may be disposed within the vacuum chamber.

The means for permitting the reactive ion etching process may be implemented by the reactive ion etching method so that the multilayer magnetic film can be etched, thereby providing the magnetoresistive device, and the means for permitting the ion beams may be implemented by the ion beam etching method. Furthermore, a means for permitting the reactive ion etching process to occur for the hard mask layer with the photoresist layer as the PR mask may be provided within the vacuum chamber so that it may be disposed ahead of the reactive ion etching means.

Furthermore, the ion beam applying means may be followed by a thin film forming means for forming a thin film or protective film on the multilayer magnetic film. The thin film forming means may also be disposed within the vacuum chamber.

The method for manufacturing magnetoresistive devices that may be used in conjunction with the inline-type apparatus described above includes the steps that will be described in connection with FIG. 3. Firstly, a substrate may be transferred into the apparatus, and may be ready to be processed in accordance with the steps of the method.

The reactive ion etching process including the hard mask layer etching process and the multilayer magnetic layer etching process may be performed. For example, the reactive ion etching process may proceed in the following sequence. That is, the hard mask layer etching process may be performed with the photoresist layer on the multilayer magnetic film being as the PR mask (step 301).

Then, the multilayer magnetic film etching process may be performed (step 302).

Following the step 302, the ion beam providing process may be performed so that the damaged layer can be removed by exposing it to the ion beams (step 303).

Following the step 303, the multilayer magnetic film from which the damaged layer has been removed may be cleaned and covered with the protective film (step 304). Finally, the substrate may be transferred in its clean state from the apparatus to the outside.

The steps described above may be performed within the vacuum chamber that is internally maintained to be in the sustained vacuum state by using a vacuum pump.

Even the inline-type apparatus described above can provide the high quality magnetoresistive devices when it is used in conjunction with the disclosed method. This is because the damaged layer that will inevitably be formed on the multilayer magnetic film during the reactive ion etching process can be removed by exposing the damaged layer to the ion beams. In addition, the magnetic properties can also be enhanced, thus improving the yield and therefore increasing the manufacturing efficiency.

EXPLANATION OF REFERENCE NUMERALS

10 Substrate on which a multilayer magnetic layer for providing a magnetoresistive device
11 Multilayer magnetic film
12 Hard mask layer
13 Photoresist layer
14 PR mask
15 Damaged layer
16 Protective film
20 Manufacturing/Apparatus
21 Vacuum transfer chamber
22 First reactive ion etching chamber
23 Second reactive ion etching chamber
24 Ion beam etching chamber
25 Film forming chamber
26 Wafer loader

The invention claimed is:

1. A method for manufacturing magnetoresistive devices, each of the devices having a multilayer magnetic film formed on a substrate so that the formed multilayer magnetic film can act as a magnetoresistive device, the method comprising:
    processing the multilayer magnetic film through a reactive ion etching process using an etching gas including alcohol containing at least one or more hydroxyl groups; and
    removing a damaged layer formed in the reactive ion etching process by etching the formed multilayer magnetic film using irradiation of ion beams which have accelerating voltages between 50 and 200 V and ion currents between 50 and 200 mA.

2. The method as defined in claim 1, wherein the irradiating the formed multilayer magnetic film with ion beams includes exposing the formed multilayer magnetic film to the ion beams at any of the incident angles between 5 and 80 degrees with regard to the surface of the formed multilayer magnetic film.

3. The method as defined in claim 1, wherein the irradiating the formed multilayer magnetic film with ion beams includes exposing the formed multilayer magnetic film to the ion beams at any of the incident angles between 30 and 60 degrees with regard to the surface of the formed multilayer magnetic film.

4. The method as defined in claim 1, wherein the irradiating the formed multilayer magnetic film with ion beams includes exposing the formed multilayer magnetic film to the ion beams by permitting the substrate having the multilayer magnetic film formed thereon to rotate.

5. The method as defined in claim 1, wherein the irradiating the formed multilayer magnetic film with ion beams is followed by forming a protective film, wherein the irradiating the formed multilayer magnetic film with ion beams and the forming a protective film being performed under a sustained vacuum condition.

6. The method as defined in claim 5, wherein the forming a protective film is performed by permitting a sputtering process to take place in the high frequency range of between above 1 KHz and below 100 MHz and in the high pressure vacuum range of between above 1 Pa and below 20 Pa.

* * * * *